United States Patent
Chuang

(10) Patent No.: US 7,961,450 B2
(45) Date of Patent: Jun. 14, 2011

(54) ANTISTATIC APPARATUS

(75) Inventor: Kuo-Ming Chuang, Hsinchu (TW)

(73) Assignee: Getac Technology Corporation, Hsinchu (TW)

( * ) Notice: Subject to any disclaimer, the term of this patent is extended or adjusted under 35 U.S.C. 154(b) by 383 days.

(21) Appl. No.: 12/167,970

(22) Filed: Jul. 3, 2008

(65) Prior Publication Data

US 2010/0002352 A1   Jan. 7, 2010

(51) Int. Cl.
*H02H 3/22* (2006.01)
*H05F 3/02* (2006.01)

(52) U.S. Cl. .......................... 361/212; 361/220; 361/222

(58) Field of Classification Search .................. 361/212, 361/220, 222
See application file for complete search history.

(56) References Cited

U.S. PATENT DOCUMENTS

| 6,859,351 B2 * | 2/2005 | Byrne et al. | 361/220 |
| 7,660,095 B2 * | 2/2010 | Shato et al. | 361/120 |

* cited by examiner

*Primary Examiner* — Stephen W Jackson
*Assistant Examiner* — Tien Mai

(57) ABSTRACT

An antistatic apparatus selectively coupled to an electrical component having a first end and a second end is proposed in the invention. The antistatic apparatus includes a first soldering portion, a second soldering portion, a first discharging portion and a second discharging portion. The first soldering portion selectively connected to the first end of the electrical component. The second soldering portion selectively connected to the second end of the electrical component. The first discharging portion connected to the first soldering portion and rotated clockwise for an angle. The second discharging portion connected to the second soldering portion and rotated counter-clockwise for the angle to provide a discharge path corresponding to the first discharging portion, electrostatic current of the first soldering portion being discharged into the second soldering portion through the discharge path.

17 Claims, 5 Drawing Sheets

ANTISTATIC APPARATUS

FIELD OF THE INVENTION

The present invention relates to an antistatic apparatus, and more particularly to an antistatic apparatus that may be coupled to electrical components.

DESCRIPTION OF PRIOR ART

Conventionally, layouts in a circuit are usually formed in a way that allows different components to be placed on same solder junctions, such that the components may overlap said solder junctions, and one of the components is allowed to operate selectively, while other components overlaid may not operate. The overlapping of components has the major advantage that often only a small portion of components requires minor changes in different layouts, so that if the method of overlapping components is not used the whole circuit would need to be rearranged all over again, which subsequently increases the circuit layout design cost, whereas if the method of overlapping components is used the overlapping components may be selectively enabled/disabled, which effectively allows operations to be switched between different components without the need to rearrange the layouts, consequently reducing circuit layout design costs.

As the semiconductor manufacturing process and single-chip technology continue to advance along with the booming trend of the miniaturization of electronic products (particularly handheld electronic products), the need to solve the problem of electrostatic discharge in circuits has also become more urgent. The electro static discharge is a major cause of damage to electronic components or electronic systems in most cases, and damage caused by electrostatic discharge also harms the semiconductor components, consequently impeding the functions of integrated circuits and leading to malfunctioning of the electronic products. Taking integrated circuits as an example, the electrical voltage supplied in general integrated circuits is approximately 5V, 3.3V, or lower. However, the electrical voltage of electrostatic discharge may reach as high as several thousand volts, tens of thousands volts, or even higher, which is very damaging. Because instantaneous electro static discharge may generate such strong electrical currents, it is important to provide guarding measures against the electro static discharge in circuits.

In prior art, the electro static discharge is usually achieved by using discharging points, which employs two corresponding conductive points to generate the point discharge effect in a circuit, so that abruptly generated electrostatic current is guided into a grounding end of the circuit and the components in the circuit may be protected from malfunctioning caused by damaging electrostatic current.

To achieve the aim of guarding against electrostatic discharge for the overlapping components in layouts of a circuit, discharging points are usually placed on same solder junctions. When the solder junctions are used as guards against electrostatic discharge, the discharging points are not coated with an insulating paint, and the solder junctions are not placed with other electrical components, so as to allow the discharging points to be used for discharging and guarding against electrostatic discharge. In contrast, if the solder junctions of the layouts are not used for guarding against electrostatic discharge, the discharging points placed thereon would be coated with an insulating paint to render said discharging points useless for discharging, and other electrical components may be further placed on the solder junctions in order to achieve other functions.

However, when the solder junctions are used for electrostatic discharge in the prior art, no further electrical components may be placed on said solder junctions, and the electrical components must be placed on other solder junctions, which increases solder junctions in the circuit and elevates related costs. Moreover, when discharging points placed on the solder junctions are not used for electrostatic discharge, but other electrical components are also placed on the solder junctions, problems such as short-circuiting or component drifting resulted from tin paste overflows may arise when the components are passed through tin stoves.

Therefore, problems caused by the electrostatic discharge guarding devices overlapped with the electrical components in circuit layouts of prior art have become an issue that requires an urgent solution.

SUMMARY OF THE INVENTION

For the above reasons, an antistatic apparatus has been proposed in the invention. In the apparatus of the invention, when soldering portions thereof are connected to discharging portions thereof, and an effect of point discharge is utilized to dissipate electrostatic current, the soldering portions may be coupled to other electrical components at the same time so as to allow the electrical components to operate. As a result, the soldering portions may be fully utilized, and the required quantity of the soldering portions is less than that in the prior art, thereby reducing costs related to positioning the soldering portions. In addition, a method for coating the insulating paint on the discharging portions is also resolved such that the problems of tin paste overflow and component drifting.

An antistatic apparatus is proposed in the invention selectively coupled to an electrical component having a first end and a second end. The antistatic apparatus includes a first soldering portion, a second soldering portion, a first discharging portion and a second discharging portion. The first soldering portion selectively connected to the first end of the electrical component. The second soldering portion selectively connected to the second end of the electrical component. The first discharging portion connected to the first soldering portion and rotated clockwise for an angle. The second discharging portion connected to the second soldering portion and rotated counter-clockwise for said angle to provide a discharge path corresponding to the first discharging portion, electrostatic current of the first soldering portion being discharged into the second soldering portion through the discharge path.

Another antistatic apparatus is also proposed in the invention coupled to an electrical component having a first end and a second end. The antistatic apparatus includes a first soldering portion, a second soldering portion, a first discharging portion and a second discharging portion. The first soldering portion connected to the first end of the electrical component. The second soldering portion connected to the second end of the electrical component. The first discharging portion connected to the first soldering portion and rotated clockwise for an angle away from a central line of the first soldering portion. The second discharging portion connected to the second soldering portion and rotated counter-clockwise for said angle away from a central line of the second soldering portion, to provide a discharge path corresponding to the first discharging portion, electrostatic current of the first soldering portion being discharged into the second soldering portion through the discharge path.

The preferred embodiments of the invention and effects thereof can be best understood by referring to the following detailed description of the preferred embodiments and the accompanying diagrams.

DETAILED DESCRIPTION OF PREFERRED EMBODIMENTS

Figure 1:
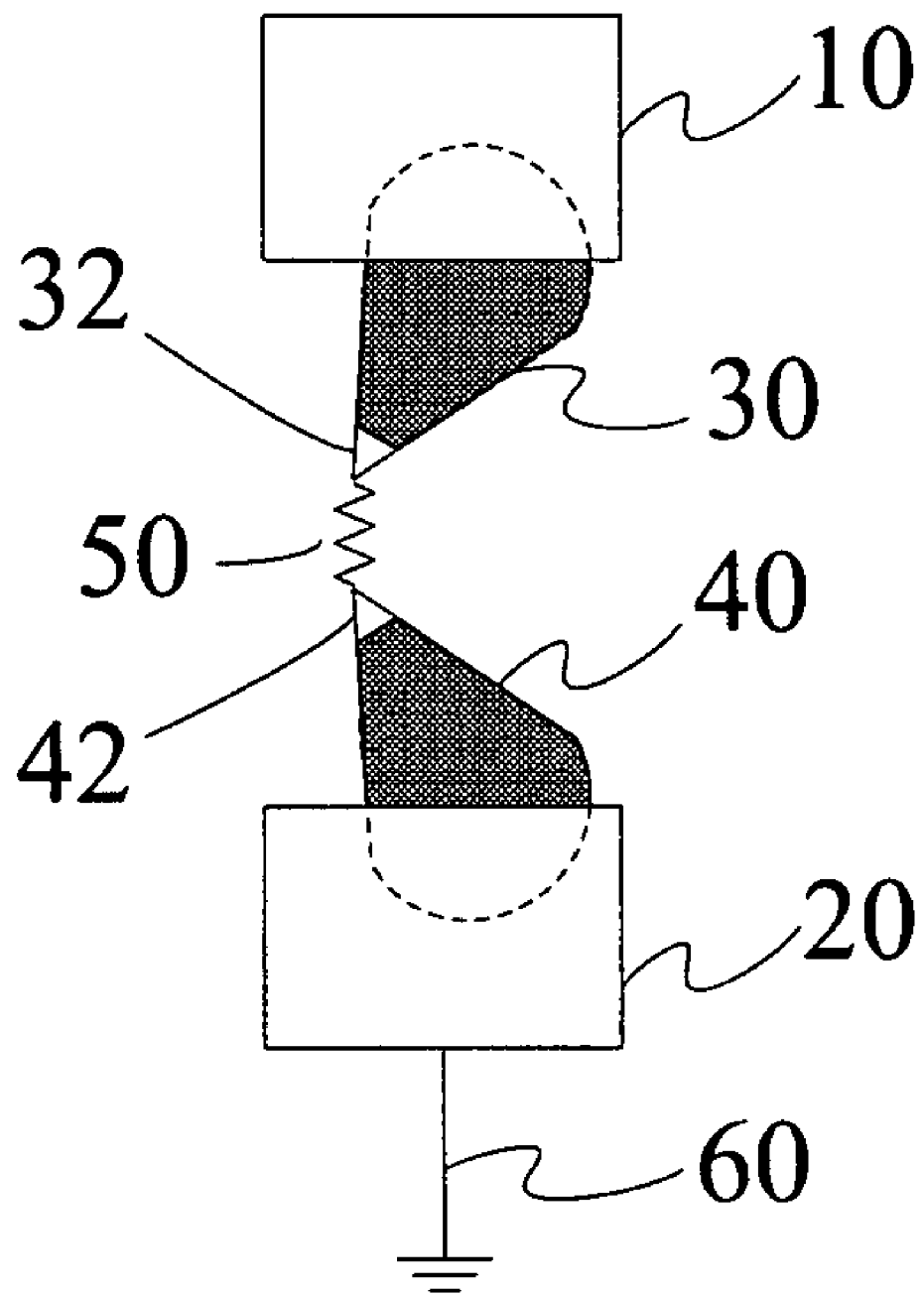
FIG. 1 is a schematic view that shows the antistatic apparatus according to a first embodiment of the invention.

Referring to FIG. 1 is a schematic view that shows the antistatic apparatus according to a first embodiment of the invention. The antistatic apparatus includes a first soldering portion 10, a second soldering portion 20, a first discharging portion 30, and a second discharging portion 40.

The first discharging portion 30 and the second discharging portion 40 is a conductor for discharging electrostatic current, for example which may be metal material, but the invention is not limited thereto. Together the first soldering portion 10 and the second soldering portion 20 make up a set of positions for a component. The component coupled to the circuit for normal operations by being soldered to the first soldering portion 10 and the second soldering portion 20.

It may be observed in FIG. 1 that the first discharging portion 30 is rotated clockwise for an angle and connected to the first soldering portion 10. The second discharging portion 40 is also rotated for said angle, with a difference from the first discharging portion 30 in that the second discharging portion 40 is rotated counter-clockwise. In other words, the directions of rotation for the two discharging portions are opposite to each other, such that points of the first discharging portion 30 and of the second discharging portion 40 may correspond to one another and form a discharge path 50. The second discharging portion 40 rotated at said angle is connected to the second soldering portion 20, and corresponds to the first discharging portion 30 to form the discharge path 50, thereby allowing electrostatic current of the first soldering portion 10 to be discharged into the second soldering portion 20 through the discharge path 50. Wherein, the angle of the first discharging portion 30 and the second discharging portion 40 rotated is an acute angle.

A grounding end 60 is further included, and is connected to the second soldering portion 20 or the second discharging portion 40. Because the second discharging portion 40 and the second soldering portion 20 are connected to one another, the effects of connecting the grounding end 60 to the second soldering portion 20 or the second discharging portion 40 are identical. As a result, electrostatic current flowing in the first soldering portion 10 may be guided into the second discharging portion 40 and then to the second soldering portion 20 through the discharge path 50, which would eventually be discharged at the grounding end 60.

Referring to FIG. 1, it is observed that the first discharging portion 30 has a first discharging point 32, and the second discharging portion 40 has a second discharging point 42; the first discharging point 32 and the second discharging point 42 being positioned corresponding to each other and allocated in the discharge path 50. Moreover, shapes of the first discharging portion 30 and the second discharging portion 40 may be selected from a group consisting of cones, triangles, and needle-like shapes.

Figure 2:
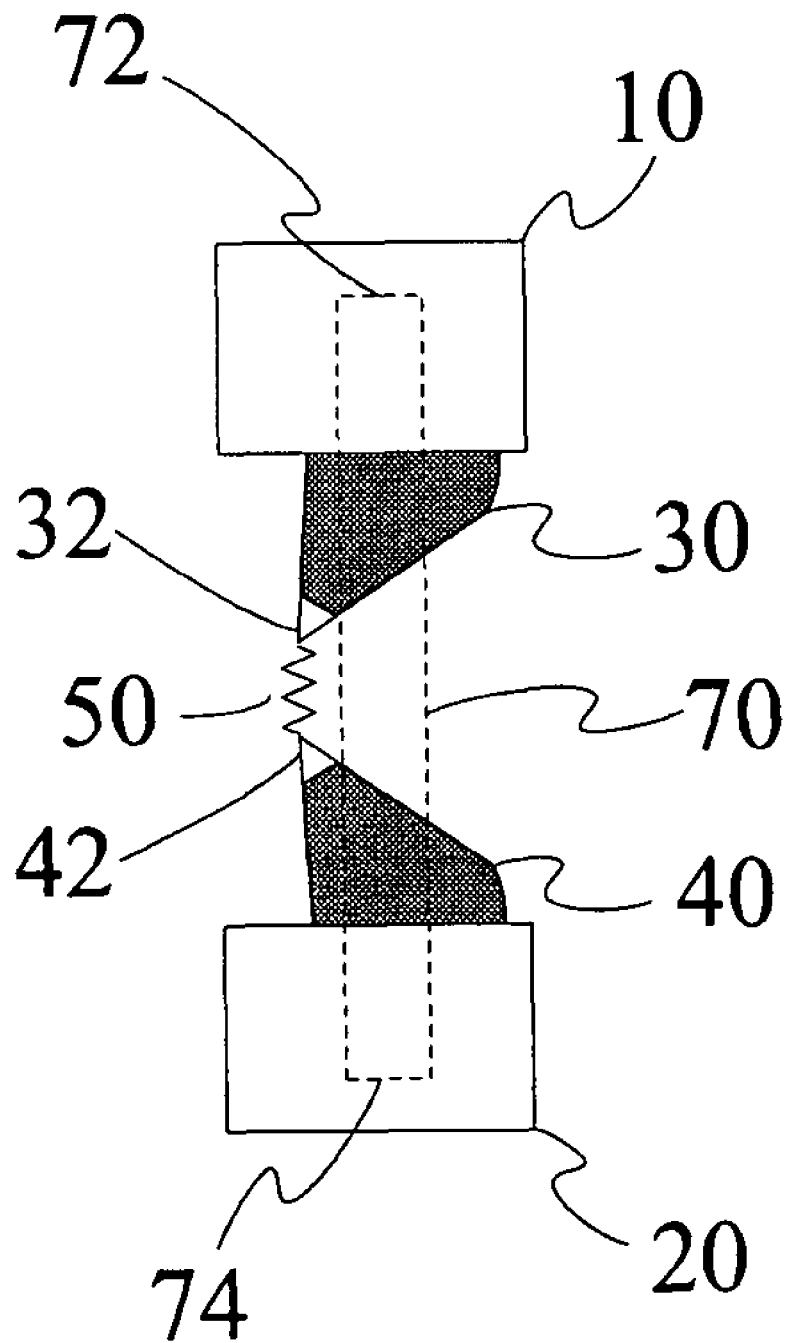
FIG. 2 is a schematic view that shows an electrical component being coupled to the first embodiment of the antistatic apparatus.

FIG. 2 is a schematic view that shows an electrical component being coupled to the first embodiment of the antistatic apparatus. An electrical component 70 may be any types of electrical components in a circuit; for example, the electrical component may be a varistor or a capacitor. The electrical component 70 has a first end 72 and a second end 74, when the electrical component 70 is to be overlapped with the first soldering portion 10 and the second soldering portion 20, the first end 72 of the electrical component 70 is connected to the first soldering portion 10, while the second end 74 of the electrical component 70 is connected to the second soldering portion 20. In other words, the first discharging portion 30, the second discharging portion 40, and the electrical component 70 are overlapped with the first soldering portion 10 and the second soldering portion 20. Because the first discharging portion 30 and the second discharging portion 40 are rotated in opposite directions at the angle before being connected to the first soldering portion 10 and the second soldering portion 20 respectively the resulting discharge path 50 deviates away from the electrical component 70. This means that when the first discharging portion 30 and the second discharging portion 40 are discharging electrostatic current, the electrostatic current flows through the discharge path 50 that can not flow through the electrical component 70, which protects the electrical component 70 from being damaged by the electrostatic discharge. Therefore, the same set of soldering portions (i.e. The first soldering portion 10 and the second soldering portion 20) may be placed simultaneously on the first discharging portion 30 and the second discharging portion 40, as well as the electrical component 70, so as to allow the components to function respectively without affecting each other, and subsequently to allow the soldering portions to be fully utilized and reduce the costs for arranging soldering portions in the circuit.

As indicated in FIG. 2, the first discharging portion 30 is coated with a layer of insulating paint thereon (indicated as gray shades in the diagram), but it should be noted that junctions between the first discharging portion 30 and the first soldering portion 10, as well as the first discharging point 32 are not coated with the insulating paint. Similarly, the second discharging portion 40 is coated with a layer of insulating paint thereon (indicated as gray shades in the diagram), and junctions between the second discharging portion 40 and the second soldering portion 20, as well as the second discharging point 42 are not coated with the insulating paint. This method of coating the insulating paint not only allows electrostatic current to dissipate through the point discharge effect between the first discharging point 32 and the second discharging point 42, but also protects the aforesaid antistatic apparatus from tin paste overflows or component drifting when passing through tin stoves; reasons are given below.

The first soldering portion 10 and the second soldering portion 20 are positions for receiving tin, and have tin paste spread thereon when passing through tin stoves. As a result of this process high temperature turns the tin paste into liquid and allows the melted tin to flow, consequently raising the problems of short-circuiting or component drifting caused by melted tin flowing. By using the method of coating insulating paints proposed in the invention, surfaces of the first discharging portion 30 and the second discharging portion 40 are allowed to protrude slightly to form slightly bulging shields after the first discharging portion 30 and the second discharging portion 40 are coated with the insulating paint. When liquid tin flowing on the first soldering portion 10 and the second soldering portion 20 runs into the slightly bulging insulating paints on the first discharging portion 30 and the second discharging portion 40, the insulating paints may serve as shields that block the flowing liquid tin from flowing further outwards, thereby preventing the problems of tin paste overflows and component drifting from occurring.

Figure 3:
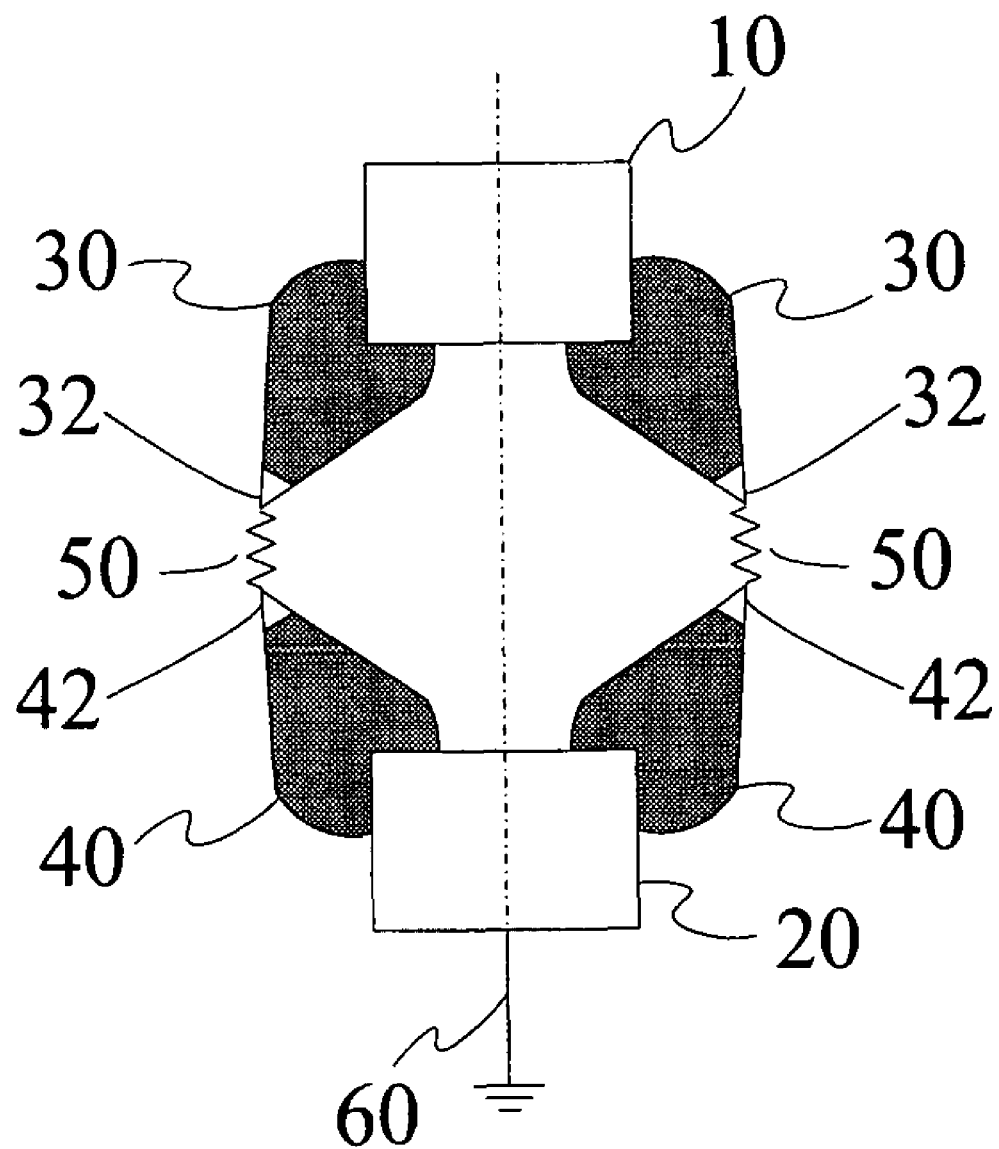
FIG. 3 is a schematic view that shows the antistatic apparatus according to a second embodiment of the invention.

FIG. 3 is a schematic view that shows the antistatic apparatus according to a second embodiment of the invention. The second embodiment differs from the first embodiment is increasing the effects of dissipating electrostatic current, more discharge paths are added in the second embodiment, thus increasing quantities of the first discharging portion 30 and the second discharging portion 40 simultaneously.

In addition, the connections between the discharging portions and the soldering portions also vary slightly, wherein the first discharging portion 30 deviates from a central line of the first soldering portion 10, and is rotated clockwise for an angle and connected to the first soldering portion 10 respectively. Similarly, the second discharging portion 40 deviates from a central line of the second soldering portion 20, and is rotated fro the angle, the only difference from the first discharging portion 30 being that the second discharging portion 40 is rotated counter-clockwise and connected to the second soldering portion 20 respectively. Wherein, the angle of the first discharging portion 30 and the second discharging portion 40 rotated is an acute angle. The directions of rotation for the first discharging portion 30 and the second discharging portion 40 are opposite to each other, such that the first discharging point 32 of each said first discharging portion 30 and the second discharging point 42 of each said second discharging portion 40 may correspond to one another and form multiple discharge paths 50. Therefore, electrostatic current flowing in the first soldering portion 10 may be discharged into the second soldering portion 20 through one or multiple discharge paths 50. Wherein the grounding end 60 may be connected to the second soldering portion 20 or the second discharging portion 40.

Figure 4:
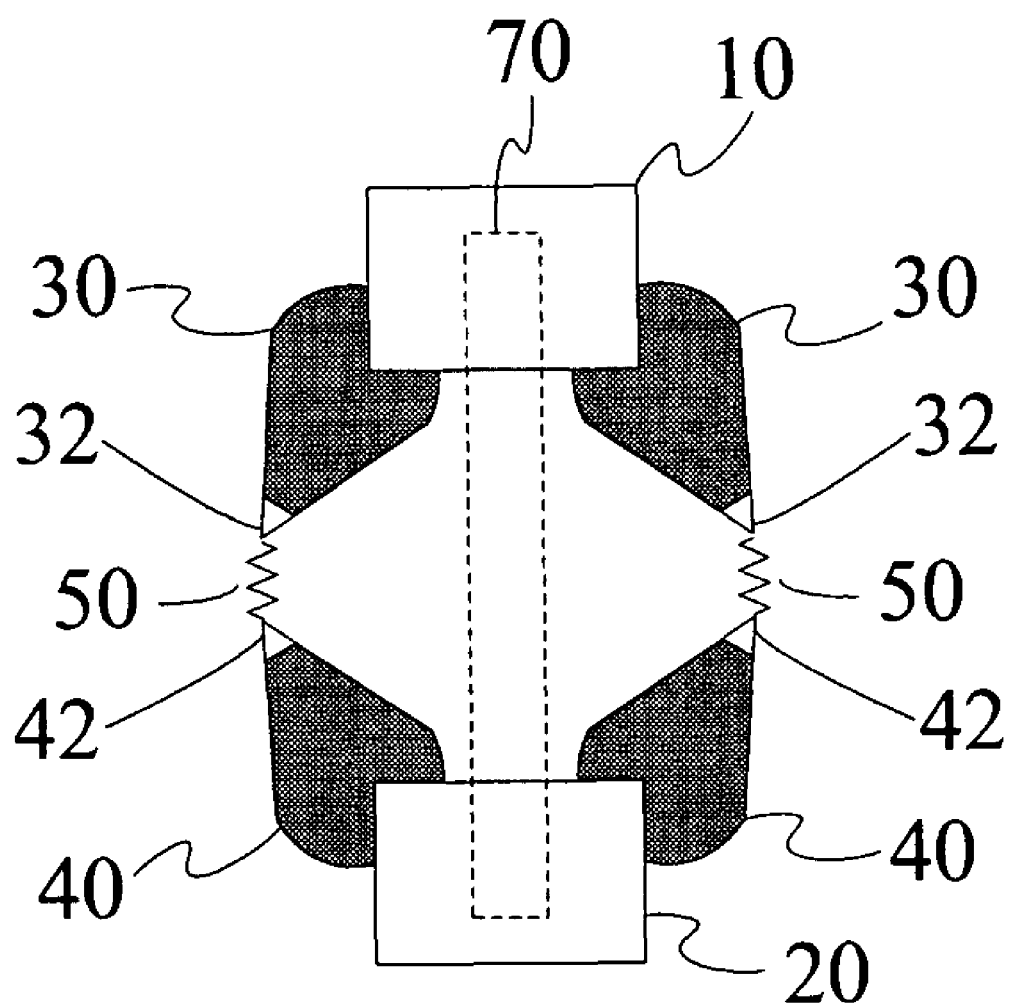
FIG. 4 is a schematic view that shows an electrical component being coupled to the second embodiment of the antistatic apparatus.

FIG. 4 is a schematic view that shows the electrical component 70 being coupled to the second embodiment of the antistatic apparatus. The first discharging portion 30 and the second discharging portion 40 in the second embodiment deviate from the central lines of the first soldering portion 10 and the second soldering portion 20, before being rotated to form opposite angles and connected to the first soldering portion 10 and the second soldering portion 20. Therefore, it may be seen in FIG. 4 that the discharge path 50 is further away from the electrical component 70 so that when the first discharging portion 30 and the second discharging portion 40 are discharging electrostatic current, the electrostatic current flows through the discharge path 50 that can not flow through the electrical component 70, thereby protecting the electrical component 70 from being damaged by the electrostatic discharge.

Figure 5A:
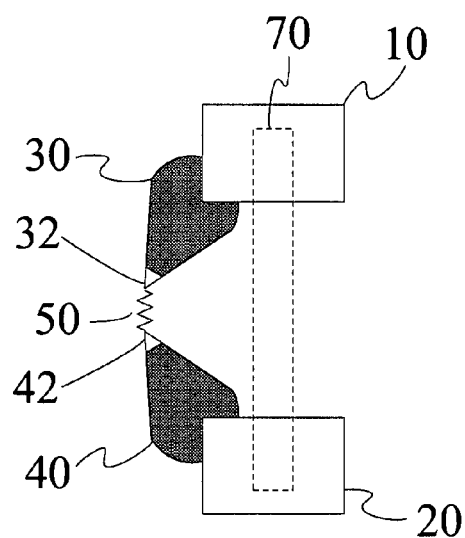
FIG. 5A is a schematic view (1) that shows an electrical component being coupled to the third embodiment of the antistatic apparatus.
Figure 5B:
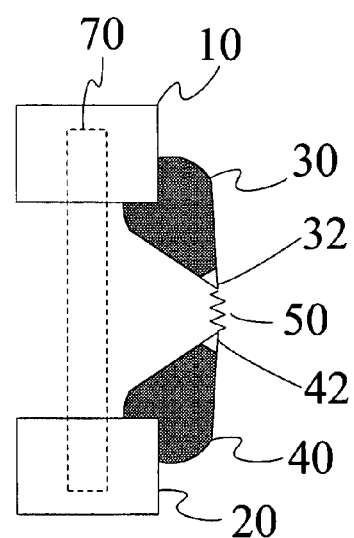
FIG. 5B is a schematic view (2) that shows an electrical component being coupled to the third embodiment of the antistatic apparatus.

In the aforesaid second embodiment, two of the first discharging portion 30 and of the second discharging portion 40 are provided respectively, as examples for elucidating the embodiment, but the quantities thereof are not limited to two, which may be more or only one and is adjusted to actual requirements. Referring to FIGS. 5A and 5B, in which only one first discharging portion 30 and one second discharging portion 40 corresponding to each other are provided. The main difference of this embodiment from the first embodiment is that: the first discharging portion 30 and the second discharging portion 40 deviate from the central lines of the first soldering portion 10 and the second soldering portion 20, such that the first soldering portion 10 may correspond to the second soldering portion 20 and form a discharge path 50, and the resulted discharge path 50 is further away from the electrical component 70 overlapped thereon. This means that when the first discharging portion 30 and the second discharging portion 40 are discharging electrostatic current, the electrical component 70 will not be affected. Therefore, when the first soldering portion 10 and the second soldering portion 20 are respectively placed on the first discharging portion 30 and the second discharging portion 40 for guarding against electrostatic discharge, the electrical component 70 may be simultaneously placed on the first soldering portion 10 and the second soldering portion 20, and the electrical component 70 may function normally.

The preferred embodiments of the present invention described above are meant to illustrate the preferred embodiments of the present invention and are not meant to limit the scope of the present invention; those skilled in the relevant fields would understand that the modification and changes made to the embodiments should be within the scope of the present invention. Thus, the scope of the protection should be determined by the following claims.

What is claimed is:

1. An antistatic apparatus selectively coupled to an electrical component having a first end and a second end, the antistatic apparatus comprising:
    a first soldering portion selectively connected to the first end of the electrical component;
    a second soldering portion selectively connected to the second end of the electrical component wherein the first and second soldering portions define a central axis there between;
    at least one first discharging portion connected to the first soldering portion and oriented in a direction rotated clockwise for an angle away from the central axis; and
    at least one second discharging portion connected to the second soldering portion and oriented in a direction rotated counter-clockwise for said angle away from the central axis such that the first and second discharging portions are located on the same side of the central axis, to provide a discharge path corresponding to the first discharging portion, electrostatic current of the first soldering portion being discharged into the second soldering portion through the discharge path, wherein the first discharging portion has a first discharging point, and the second discharging portion has a second discharging point, the first discharging point and the second discharging point being positioned corresponding to each other and allocated in the discharge path, and wherein an insulating paint is coated on the first discharging portion yet not coated on the first discharging point and a junction between the first discharging portion and the first soldering portion.

2. The antistatic apparatus of claim 1, wherein the angle is an acute angle.

3. The antistatic apparatus of claim 1, wherein the shape of the first discharging portion is selected from a group consisting of cones, triangles, and needle-like shapes.

4. The antistatic apparatus of claim 1, wherein the shape of the second discharging portion is selected from a group consisting of cones, triangles, and needle-like shapes.

5. The antistatic apparatus of claim 1, wherein an insulating paint is coated on the second discharging portion yet not coated on the second discharging point and a junction between the second discharging portion and the second soldering portion.

6. The antistatic apparatus of claim 1, further comprising: a grounding end being connected to the second soldering portion.

7. The antistatic apparatus of claim 1, further comprising: a grounding end being connected to the second discharging portion.

8. An antistatic apparatus coupled to an electrical component having a first end and a second end, the antistatic apparatus comprising:
- a first soldering portion connected to the first end of the electrical component;
- a second soldering portion connected to the second end of the electrical component wherein the first and second soldering portions define a central axis there between;
- at least one first discharging portion connected to the first soldering portion and oriented in a direction rotated clockwise for an angle away from the central axis portion; and
- at least one second discharging portion connected to the second soldering portion and oriented in a direction rotated counter-clockwise for said angle away from a the central axis such that the first and second discharging portions are located on the same side of the central axis, to provide a discharge path corresponding to the first discharging portion, electrostatic current of the first soldering portion being discharged into the second soldering portion through the discharge path, wherein said first discharging portion has a first discharging point and said second discharging portion has a second discharging point, said first discharging point and said second discharging point being positioned corresponding to each other and allocated in the discharge path, and wherein an insulating paint is coated on the first discharging portion yet not coated on the first discharging point and a junction between the first discharging portion and the first soldering portion.

9. The antistatic apparatus of claim 8, wherein the angle is an acute angle.

10. The antistatic apparatus of claim 8, wherein the shape of the first discharging portion is selected from a group consisting of cones, triangles, and needle-like shapes.

11. The antistatic apparatus of claim 8, wherein the shape of the second discharging portion is selected from a group consisting of cones, triangles, and needle-like shapes.

12. The antistatic apparatus of claim 8, wherein an insulating paint is coated on the second discharging portion yet not coated on the second discharging point and a junction between the second discharging portion and the second soldering portion.

13. The antistatic apparatus of claim 8, further comprising: a grounding end being connected to the second soldering portion.

14. The antistatic apparatus of claim 8, further comprising: a grounding end being connected to the second discharging portion.

15. An antistatic apparatus coupled to an electrical component having a first end and a second end, the antistatic apparatus comprising:
- a first soldering portion connected to the first end of the electrical component;
- a second soldering portion connected to the second end of the electrical component, wherein the first and second soldering portion define a central axis there between, and are arranged such that the electrical component extends between the first soldering portion and the second soldering portion along the central axis;
- at least one first discharging portion connected to the first soldering portion and oriented in a direction rotated clockwise in a plane for an angle away from the central axis; and
- at least one second discharging portion connected to the second soldering portion and oriented in a direction rotated counter-clockwise in the plane for said angle away from the central axis such that the first and second discharging portion are located an a same side of the central axis, to provide a discharge path corresponding to the first discharging portion, electrostatic current of the first soldering portion being discharged into the second soldering portion through the discharge path wherein the first discharging portion has a first discharging point, and the second discharging portion has a second discharging point, the first discharging point and the second discharging point being positioned corresponding to each other and allowed in the discharge path, and wherein an insulating paint is coated on the first discharging portion yet not coated on the first discharging point and a junction between the first discharging point and the first soldering portion.

16. The antistatic apparatus of claim 15, further comprising: a grounding end being connected to the second soldering portion.

17. The antistatic apparatus of claim 15, wherein said angle is acute.

* * * * *